United States Patent
Matsuura et al.

(10) Patent No.: US 7,032,803 B2
(45) Date of Patent: Apr. 25, 2006

(54) JET NOZZLE STRUCTURE FOR SOLDERING APPARATUS

(75) Inventors: Nobuhiro Matsuura, Fukushima (JP); Kaoru Yamaguchi, Fukushima (JP)

(73) Assignees: Tohoku koki Co., Ltd., Fukushima (JP); Koki Tec Corp., Saitama (JP)

( * ) Notice: Subject to any disclaimer, the term of this patent is extended or adjusted under 35 U.S.C. 154(b) by 302 days.

(21) Appl. No.: 10/679,165

(22) Filed: Oct. 4, 2003

(65) Prior Publication Data

US 2005/0072828 A1    Apr. 7, 2005

(51) Int. Cl.
*B23K 1/08* (2006.01)
(52) U.S. Cl. ...................................................... 228/37
(58) Field of Classification Search ................ 228/37, 228/36, 256, 259, 260; 427/431, 432, 433, 427/434.3; 118/410
See application file for complete search history.

(56) References Cited

U.S. PATENT DOCUMENTS

| | | | |
|---|---|---|---|
| 3,379,356 A * | 4/1968 | Eith | 228/37 |
| 4,254,158 A * | 3/1981 | Fukuzuka et al. | 427/8 |
| 4,610,391 A * | 9/1986 | Nowotarski | 228/219 |
| 4,981,249 A | 1/1991 | Kawashima et al. | |
| 5,042,708 A | 8/1991 | Ledermann et al. | |
| 5,121,874 A * | 6/1992 | Deambrosio et al. | 228/219 |
| 5,152,447 A | 10/1992 | Wallgren et al. | |
| 5,176,307 A * | 1/1993 | Hagerty et al. | 228/37 |
| 5,193,734 A | 3/1993 | Takayama et al. | |
| 5,228,614 A | 7/1993 | Elliott et al. | |
| 6,138,890 A | 10/2000 | Kanno et al. | |
| 6,247,630 B1 | 6/2001 | Terry et al. | |
| 6,499,645 B1 | 12/2002 | Arakane | |

* cited by examiner

*Primary Examiner*—Jonathan Johnson
(74) *Attorney, Agent, or Firm*—Muramatsu & Associates

(57) ABSTRACT

A jet nozzle structure for a soldering apparatus for soldering a local area of a substrate on which electric components are placed improves the soldering performance. The soldering apparatus includes a tubular body formed on a soldering bath filled with molten solder, an opening rim at a top of the tubular body forming a top opening to expose the molten solder for soldering electronic components placed on a specified local area of the substrate, and one or more flow openings which are established on a side wall of the tubular body at a position lower than the opening rim by a predetermined distance.

4 Claims, 4 Drawing Sheets

JET NOZZLE STRUCTURE FOR SOLDERING APPARATUS

FIELD OF THE INVENTION

This invention relates to a jet nozzle structure for a soldering apparatus used for soldering a local area of a printed circuit board with electric components by contact the jet nozzle which ejects molten solder with the local area of the printed circuit board.

BACKGROUND OF THE INVENTION

Electric components are normally mounted on a printed circuit board by bonding electrodes of the electric components to the printed circuit board by means of soldering for establishing electrical connection. Conventionally, lead wires of electric components are inserted in through holes of a printed circuit board for soldering. However, because of the miniaturization of recent electrical devices, electric components without lead wires, such as SMP (surface mount parts) have become widely used which are mounted on a double-sided reflow (molten) substrate. Thus, the recent soldering method is different from the conventional method in which the lead wires are inserted into the through holes and then soldered.

Nevertheless, the conventional components are still necessary today, resulting in a mixture of the conventional components with lead wires and recent components without lead wires on a printed circuit board. For mounting these components on a printed circuit board, after the lead wires being inserted in the through holes, the printed circuit board is put through a flow soldering bath for soldering the part where the lead wires are inserted. Such a printed circuit board is called a flow substrate (hereafter referred to as "substrate").

When mounting such electrical components having traditional lead wires to the substrate, a soldering apparatus with a jet nozzle which is able to apply the solder to a specified part (local area) of the substrate is used in order to increase the work efficiency. FIG. 3 is a schematic perspective view showing the essential portion (particularly, a jet nozzle portion) of such a jet nozzle type soldering apparatus.

In the jet nozzle type soldering apparatus (hereafter "soldering apparatus") M, molten solder h is contained in a soldering bath b and a part of which is circulated in the soldering apparatus by a circulation means (not shown). More specifically, the molten solder h is filled into a tubular body 20 through pipes 40 positioned at the bottom of a rectangular tubular jet nozzle 10 mounted on a base 30. The tubular body 20 of the jet nozzle 10 has an upper opening with an opening rim 20e. The molten solder h flows out in the direction as shown by an arrows a through cutouts 20m formed at the opening rim 20e at the top of tubular body 20, returning to the soldering bath b.

Because an oxide film will be formed on its surface if the surface of the molten solder h stands still, in the soldering apparatus M, the molten solder h has to be overflowed from the cutouts 20m of the jet nozzle 10 to constantly circulate the molten solder h so as not to grow the oxide film.

In the above noted conventional jet stream type soldering apparatus, as shown in FIG. 4, when a space W between two electrical components d on a substrate p is wide enough as shown in FIG. 4A, the overflowing portion f of the molten solder h (hereafter also referred to as "solder flow") does not come in contact with the adjoining electrical component. Recently, however, demands for a smaller and even more highly dense substrate are increasing, requiring further decrease in the pitch between the electrical components. Thus, a space N between the electric components has become smaller as shown in FIG. 4B.

Further, in consideration of the environment issues, lead-free solder (tin-silver-copper) has been in use instead of the conventional lead containing solder (eutectic solder of tin 6:lead 4). The lead-free solder, in comparison to the conventional lead containing solder (melting temperature of about 183° C.) has higher solidus (melting temperature of about 218° C.), which easily solidifies within the nozzle if the amount of circulation is small. Therefore, it is necessary to increase the amount of circulation of solder flow by increasing the amount of overflows of the molten solder from the cutouts 20m.

However, this means that the amount of molten solder flowing in the transversal direction from the cutouts 20m will also increase. Thus, in the case of having two electrical components close together as in FIG. 4B, the molten solder may contact with the lead wire 1 of the adjoining electrical component d, causing problems that are difficult to resolve. Since the amount of the solder flow is increased, a solution of this problem by increasing the number of cutouts 20m can be conceivable. However, because the space in the jet nozzle is limited due to the closeness of the electrical components, this solution is not practical to resolve the problem.

Moreover, in the method of overflowing the molten solder from the opening rim 20e noted above, flux that has been applied to the local area of the substrate in advance will be washed away by the surface flow of the molten solder, causing soldering errors.

SUMMARY OF THE INVENTION

Therefore, it is an object of the present invention to provide a jet nozzle structure of a local area soldering apparatus which is capable of soldering electric components having lead wires without touching the adjoining electrical component even if the electrical components are placed close together.

It is another object of the present invention to provide a jet nozzle structure of the local area soldering apparatus in which accurate soldering can be executed by establishing flow openings for the molten solder on a wall of a tubular body at a proper distance from the top opening rim of the jet nozzle.

In order to achieve the above object, in the present invention, the jet nozzle of the local area soldering apparatus is comprised of: a tubular body formed on a soldering bath filled with molten solder; an opening rim at a top of the tubular body forming a top opening to expose the molten solder for soldering electronic components placed on a specified local area of a substrate; and one or more flow openings which are established on a side wall of the tubular body at a position lower than the opening rim by a predetermined distance. In the above configuration, the molten solder circulates through the soldering bath, the tubular body, and the flow openings.

In the jet nozzle structure of the present invention, the molten solder is lead-free solder which has higher solidus than that of lead containing solder, and the amount of circulation of lead-free solder is set larger than that of lead containing solder by increasing an amount of flow of the molten solder from the flow openings.

According to the present invention, since the solder flow from the jet nozzle as mentioned above is coming out from the flow openings that are positioned lower than the top opening rim, the soldering apparatus of the present invention can avoid the solder flow from contacting with the lead wires of the adjacent electrical components place in a highly dense and compacted manner, thereby achieving the accurate soldering.

Further, since the amount of circulating the molten solder can be increased without causing the problem involved in the conventional technology, it is possible to use the lead-free solder which requires an increased amount of circulation. Furthermore, since the solder flow from the jet nozzle comes out from a position lower than the top surface of the jet nozzle, the amount of flow of the molten solder at the top surface of the jet nozzle is decreased, thereby preventing from washing out the flux on the surface of the substrate.

DETAILED DESCRIPTION OF THE INVENTION

A detailed embodiment of the jet nozzle structure of the local area soldering apparatus of the present invention will be explained below with reference to the accompanying drawings.

Figure 1:
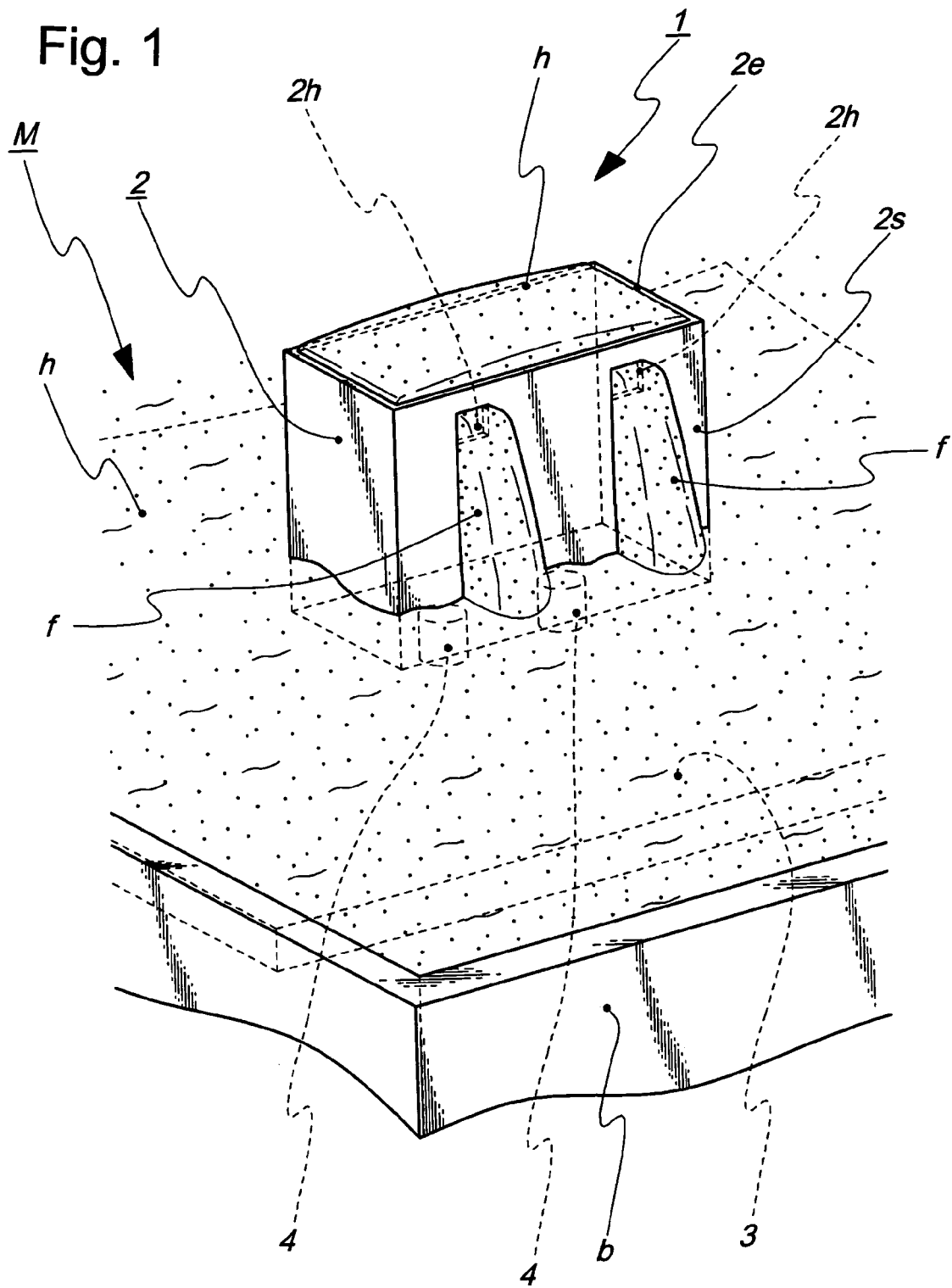
FIG. 1 is a perspective view showing the jet nozzle structure in one embodiment of the soldering apparatus of the present invention.
Figure 2:
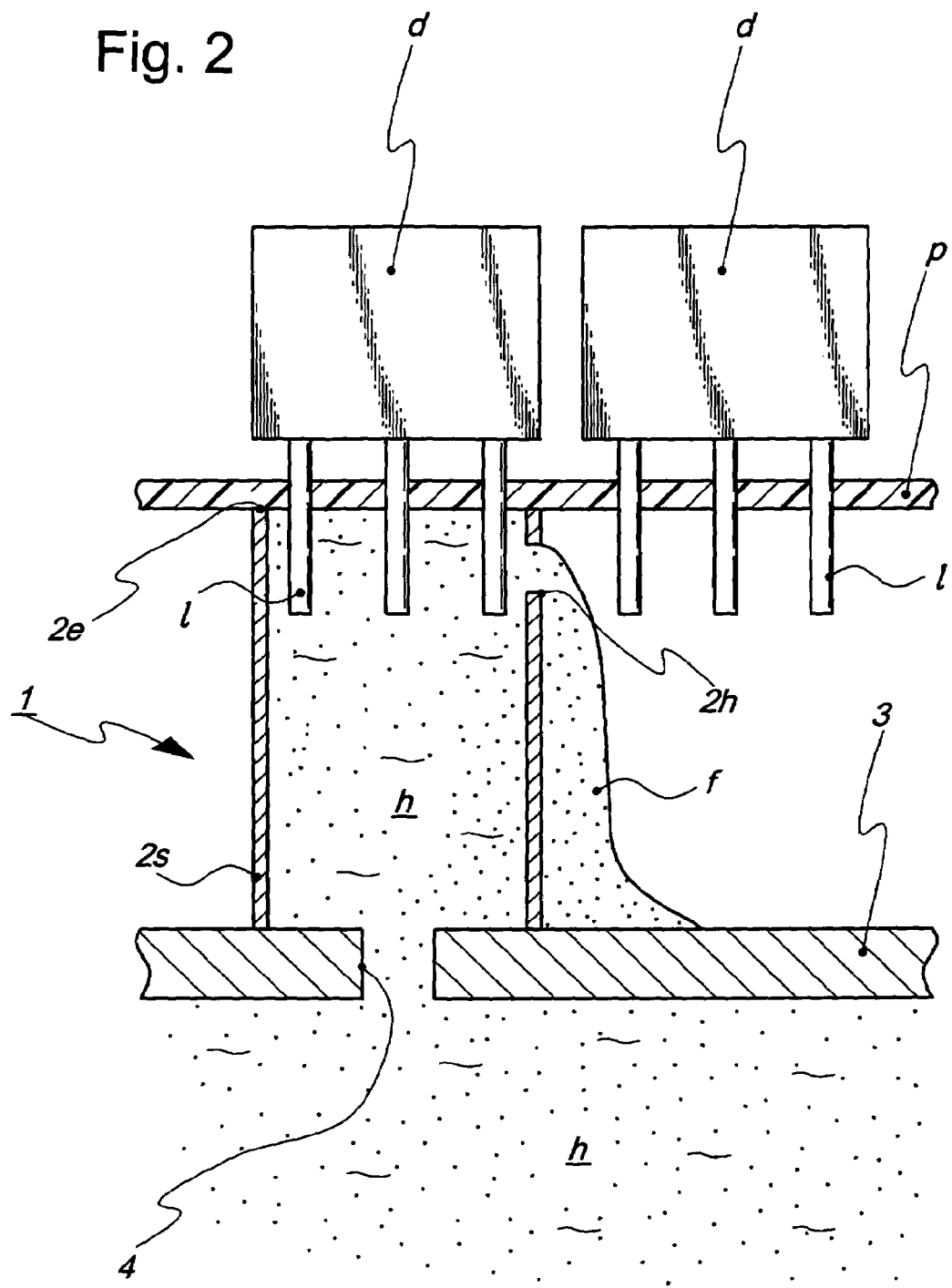
FIG. 2 is a vertical cross sectional view showing the soldering operation in accordance with the soldering apparatus of the present invention.

FIG. 1 is a perspective view showing the jet nozzle structure of an embodiment of the present invention, and FIG. 2 is a vertical cross sectional view showing the soldering operation by the soldering apparatus of FIG. 1.

Figure 3:
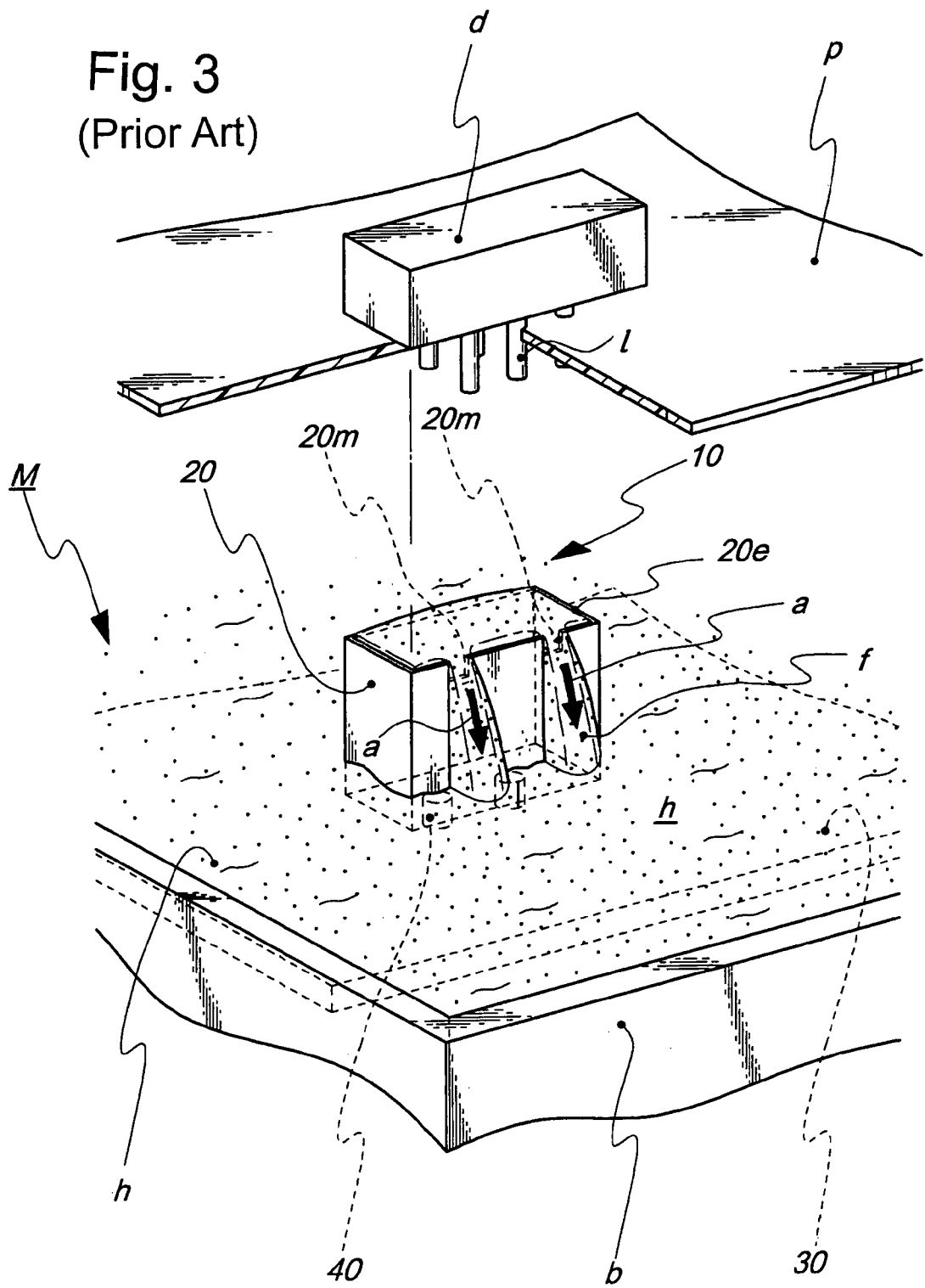
FIG. 3 is a schematic perspective view showing the structure of the jet nozzle in the conventional soldering apparatus.
Figure 4A:
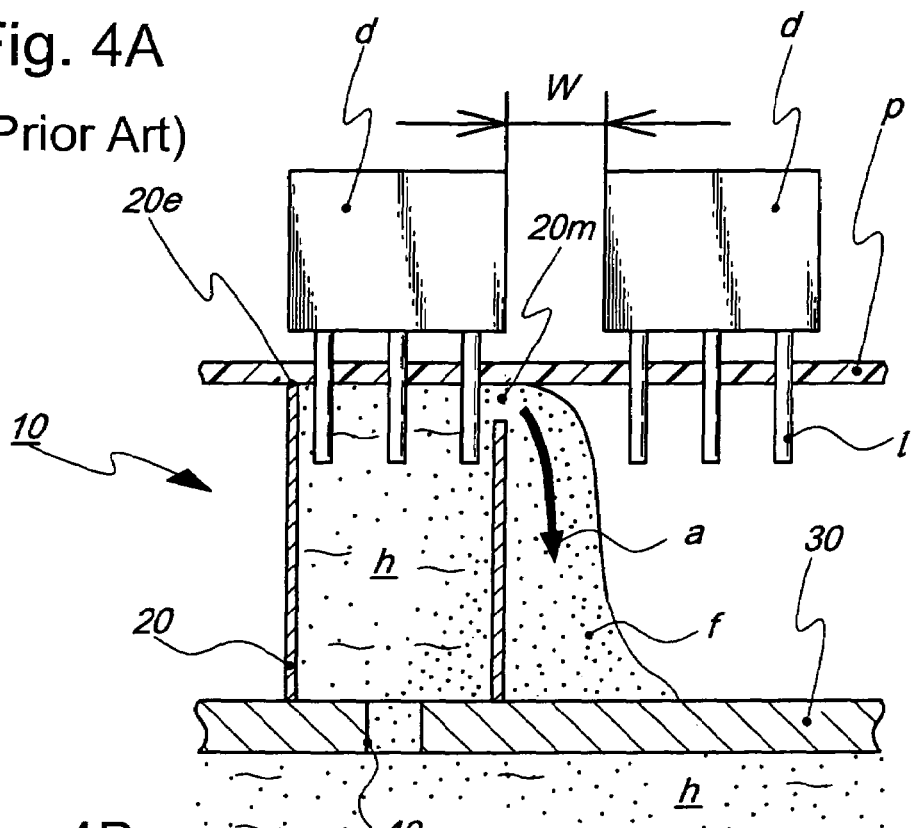
FIG. 4 is a vertical cross sectional view showing the soldering operation in the conventional soldering apparatus using the jet nozzle.
Figure 4B:
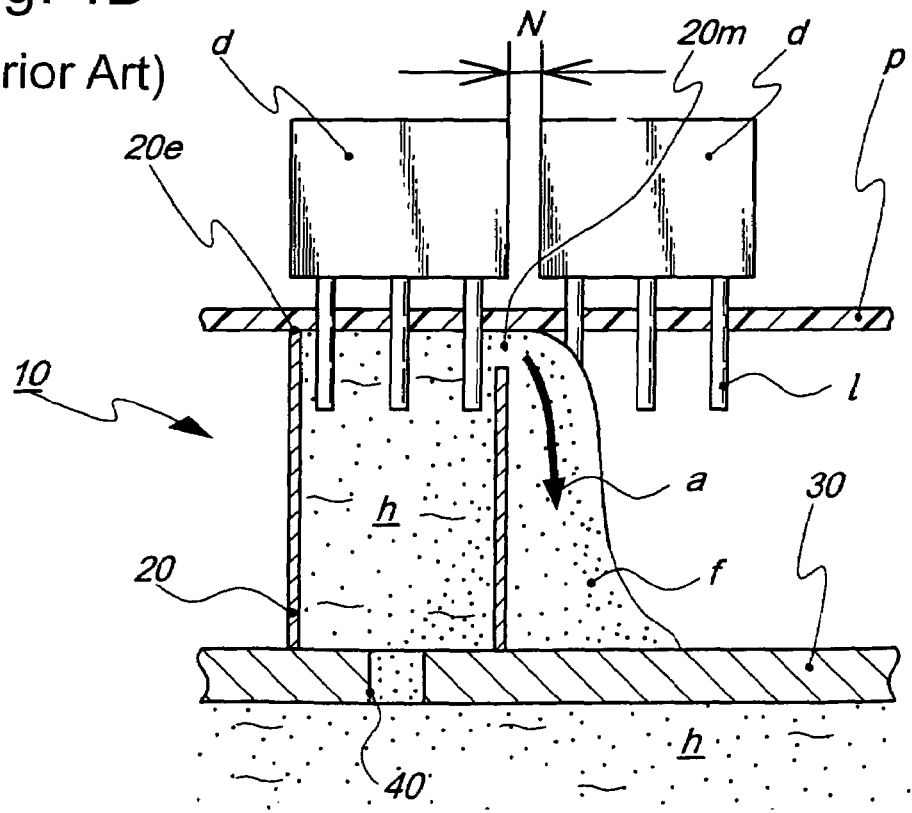

The structure of the jet nozzle of the present invention is the same as that of the conventional jet nozzle in a large extent except for a modification added thereto, thus, the identical parts are denoted by the same reference labels as that of the conventional example of FIGS. 3 and 4, and their detailed explanation is omitted here.

The jet nozzle 1 is structured with a tubular body 2 having an opening rim 2e forming an upper opening of a predetermined shape, and is installed at the top surface of the base 3 that is established on the solder bath b. The upper opening defined by the opening rim 2e encloses a specified part (local area) of the substrate p to be soldered where lead wires of electrical components d are inserted. The shape and size of such an opening rim is specially formed to match the unique shape and size of the local area on the surface of the substrate p.

On the wall 2s of the jet nozzle 1, at a predetermined distance from the opening rim 2e, one or more flow openings 2h are created. In this embodiment, the shape of the flow opening 2h is rectangular, and several of them are lined side by side on one side of the wall 2s. The number and locations of the flow openings are properly established in consideration of the adjoining electrical components d, such as the density, size, lengths of the lead wires, etc. In the preferred embodiment, the flow openings are formed about 2 mm below the opening rim 2e. The shape of the flow opening can be a circle, an ellipse, or a long horizontal slit.

By structuring the jet nozzle 1 as mentioned above, the molten solder h which is stored in the solder bath b and is driven by circulation means (not shown) moves upwardly within the tubular body 2 through the pipes 4. This molten solder h rises to the level of the opening rim 2e as well as flows out from the flow openings 2h. Since the position of the flow openings 2h is lower than the opening rim 2e, the solder flow f from the flow openings 2h will not too much move toward the transversal direction. Thus, as shown in FIG. 2, it is able to avoid the solder flow f from coming in contact with lead wires 1 of adjacent electrical components d placed in a highly dense manner on the substrate p.

As a result, even when the amount of circulating the molten solder is increased, the problem involved in the conventional technology will not arise in the jet nozzle of the present invention. As a result, it is possible to use the lead-free solder which requires an increased amount of circulation. Further, since the solder flow f from the jet nozzle 1 comes out from a position lower than the top surface of the jet nozzle 1, the amount of flow of the molten solder at the top surface of the jet nozzle is decreased, thereby preventing from washing out the flux on the surface of the substrate p.

The height of the rising level of the molten solder h from the opening rim 2e is determined based on the relationship between the flow amount created by the circulation means and the flow amount from the flow openings 2h on the side wall of the jet nozzle 1.

As described in the foregoing, the soldering work using the jet nozzle 1 is performed by contacting the opening rim 2e formed to match the unique size and shape of the local area on the substrate p, and circulating the molten solder through the tubular body 2 by the circulation means (not shown) whereby the lead wires 1 of the electrical components d are soldered. In addition, a satisfactory amount of flow pressure is added to sufficiently fill the solder in the through holes of the substrate p.

Since the solder flow from the jet nozzle as mentioned above is coming out from the flow openings that are positioned lower than the top opening rim, the soldering apparatus of the present invention can avoid the solder flow from contacting with the lead wires of the adjacent electrical components place in a highly dense and compacted manner, thereby achieving the accurate soldering.

Further, since it is possible to avoid the solder flow from contacting with the adjoining components, the location of the flow openings on the tubular body of the jet nozzle as well as the efficiency of the solder flow within the tubular body can be designed with high flexibility.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A jet nozzle structure for a soldering apparatus, comprising:
  a tubular body formed on a soldering bath filled with molten solder;

an opening rim at a top of the tubular body forming a top opening to expose the molten solder for soldering electronic components placed on a specified local area of a substrate; and one or more flow openings which are established on a side wall of the tubular body at a position lower than the opening rim by a predetermined distance;

wherein the molten solder circulates through the soldering bath, the tubular body, and the flow openings.

2. A jet nozzle structure for a soldering apparatus as defined in claim 1, wherein a shape and size of the opening rim is determined based on a unique shape and size of the local area of the substrate to be soldered.

3. A jet nozzle structure for a soldering apparatus as defined in claim 1, wherein said molten solder is lead-free solder which has higher solidus than that of lead containing solder.

4. A jet nozzle structure for a soldering apparatus as defined in claim 1, wherein said molten solder is lead-free solder which has higher solidus than that of lead containing solder, and the amount of circulation of lead-free solder is set larger than that of lead containing solder by increasing an amount of flow of the molten solder from the flow openings.

* * * * *